US006975160B2

(12) United States Patent
Garrett, Jr. et al.

(10) Patent No.: US 6,975,160 B2
(45) Date of Patent: *Dec. 13, 2005

(54) SYSTEM INCLUDING AN INTEGRATED CIRCUIT MEMORY DEVICE HAVING AN ADJUSTABLE OUTPUT VOLTAGE SETTING

(75) Inventors: Billy Wayne Garrett, Jr., Mountain View, CA (US); John B. Dillon, deceased, late of Palo Alto, CA (US); by Nancy David Dillon, legal representative, Marshall, VA (US); Michael Tak-Kei Ching, Sunnyvale, CA (US); William E. Stonecynher, San Jose, CA (US); Andy Peng-Pui Chan, San Jose, CA (US); Matthew M. Griffin, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/011,077

(22) Filed: Dec. 14, 2004

(65) Prior Publication Data

US 2005/0099218 A1 May 12, 2005

Related U.S. Application Data

(63) Continuation of application No. 10/625,264, filed on Jul. 23, 2003, now Pat. No. 6,870,419, which is a continuation of application No. 10/230,931, filed on Aug. 29, 2002, now Pat. No. 6,608,507, which is a continuation of application No. 09/954,561, filed on Sep. 12, 2001, now Pat. No. 6,556,052, which is a continuation of application No. 09/882,420, filed on Jun. 14, 2001, now Pat. No. 6,462,591, which is a continuation of application No. 09/559,115, filed on Apr. 26, 2000, now Pat. No. 6,294,934, which is a continuation of application No. 09/141,675, filed on Aug. 27, 1998, now Pat. No. 6,094,075.

(60) Provisional application No. 60/073,353, filed on Feb. 2, 1998, provisional application No. 60/057,400, filed on Aug. 29, 1997.

(51) Int. Cl.[7] .............................................. G05F 1/10
(52) U.S. Cl. .................................................... 327/535
(58) Field of Search .............................. 327/77, 88, 89, 327/112, 534, 535, 537, 538, 540, 543

(56) References Cited

U.S. PATENT DOCUMENTS 5,254,883 A * 10/1993 Horowitz et al. ............. 326/30

* cited by examiner

*Primary Examiner*—Jeffrey Zweizig
(74) *Attorney, Agent, or Firm*—Vierra Magen Marcus Harmon & DeNiro LLP

(57) ABSTRACT

A system including an integrated circuit memory device. The integrated circuit device comprises a register to store a value representative of an output voltage setting. A circuit holds a value representative of an adjustment to the output voltage setting. An output driver outputs a drive voltage during a calibration operation, wherein a signal is generated based on a comparison between a signal derived from the drive voltage and a reference voltage. The signal updates the value representative of the adjustment to the output voltage setting.

35 Claims, 12 Drawing Sheets

Block Diagram of Current Control Circuitry.

Current Control Counter with TestModes

Current Control Logic Diagram

SYSTEM INCLUDING AN INTEGRATED CIRCUIT MEMORY DEVICE HAVING AN ADJUSTABLE OUTPUT VOLTAGE SETTING

This is a continuation of U.S. patent application Ser. No. 10/625,264 filed on Jul. 23, 2003 (now U.S. Pat. No. 6,870,419); which is a continuation of U.S. patent application Ser. No. 10/230,931 filed on Aug. 29, 2002 (now U.S. Pat. No. 6,608,507); which is a continuation of U.S. patent application Ser. No. 09/954,561 filed on Sep. 12, 2001 (now U.S. Pat. No. 6,556,052); which is a continuation of U.S. patent application Ser. No. 09/882,420 filed on Jun. 14, 2001 (now U.S. Pat. No. 6,462,591); which is a continuation of U.S. patent application Ser. No. 09/559,115 filed on Apr. 26, 2000 (now U.S. Pat. No. 6,294,934); which is a continuation of U.S. patent application Ser. No. 09/141,675 filed on Aug. 27, 1998 (now U.S. Pat. No. 6,094,075); which claims priority to U.S. Provisional Patent Application Ser. No. 60/073,353 filed on Feb. 2, 1998, and U.S. Provisional Patent Application Ser. No. 60/057,400 filed on Aug. 29, 1997.

BACKGROUND OF THE INVENTION

1. Field of the Invention

The present invention relates to the field of integrated circuits and high-speed buses. More specifically, the present invention relates to a circuit for a high-speed driver and techniques for obtaining rapid switching speed with low power consumption and low noise on high-speed buses.

2. Description of the Related Art

To obtain rapid switching speed on a bus with low power consumption and low noise, it is desirable for a current mode driver to set and control the current at which the driver operates. U.S. Pat. No. 5,254,883, assigned to the assignee of the present invention, and incorporated herein by reference, discusses an apparatus and method for setting and maintaining the operating current of a current mode driver for a bus. Essentially, for a bus with a master-slave architecture, there are two problems to be solved in setting the operating current on the bus. First, the operating current of the master's current mode drivers should be properly set. Second, the operating current of the slave's current mode drivers should be properly set. Once these currents are set, they are maintained at those settings despite process, voltage and temperature variations by circuitry in the master and slave devices.

A master-slave bus architecture is discussed in the '883 patent in which a master may send data to and receive data from a slave. A slave may send data to and receive data from a master, but not another slave. The master sets its operating current for its drivers and each slave sets the operating current for its drivers.

The master employs an adjustable current sink as a driver for each bus line that it drives. The current sink turns on to drive the voltage on the bus line, $V_{out}$, to a voltage closer to ground and turns off to allow a termination resistor, $R_{term}$, on the bus line to pull the bus line closer to the terminator voltage, $V_{term}$. The current in the driver, $I_d$, is set by a digital counter whose count is determined from a feedback circuit having a comparator. If the count is all zeros then no current flows in the driver and the voltage on the bus line, $V_{out}$, is the termination voltage, $V_{term}$. If the count is all ones, then the maximum current flows in the driver and the voltage on the bus line, $V_{out}$, equals $V_{term}-I_d*R_{term}$.

The feedback circuit compares a voltage reference, $V_{ref}$, to a node voltage, $V_n$, derived from a scaled reference driver which receives the count from the counter. Feedback assures that the node voltage matches the reference voltage, $V_n=V_{ref}$. When the match occurs the reference driver has an output swing (i.e., change in voltage) of $(V_{term}-V_{ref})$ and the actual output driver has a swing of $2*(V_{term}-V_{ref})$ due to the scaling between the reference driver and the actual output driver. Therefore, $V_{out}$ equals $(V_{term}-2)*(V_{term}-V_{ref})$. Thus, by selecting a value for $V_{term}$ and $V_{ref}$ any size symmetric voltage swing about $V_{ref}$ may be achieved.

The slave in the '883 patent also employs an adjustable current sink as a driver for each bus line that it drives. A counter similarly controls the value of the current in the driver such that the driver may swing between $V_{term}$ and $V_{term}-I_d*R_{term}$, where $I_d$ is the current setting in the driver of the slave. However, the value in the counter is directly proportional to the value of an RC time constant whose capacitance, C, is set by the master. The master also determines whether the value of $V_{out}$ from the driver matches $V_{ref}$ in the master. It adjusts the RC time constant so that the count in the counter will set a current in the driver and $V_{out}$ will match $V_{ref}$. Thus $V_{out}$ will equal $V_{term}-(V_{term}-V_{ref})$. In order to produce a symmetric swing about $V_{ref}$ another step is required. The master should double the value of the RC time constant which will double the count. This will produce a $V_{out}$ which is equal to $V_{term}-2*(V_{term}-V_{ref})$.

Maintenance of the current setting of the driver in the slave may be performed in a manner different from that in the master. In the slave, the effective R in the RC time constant is derived from a reference voltage and reference current. If due to variations in temperature or supply voltage, the reference current decreases then the effective R in the RC time constant increases. This increases the count and the operational current setting of the driver in the slave, thus compensating for the effect. If the reference current increases, the effective R and the count decrease, again compensating for the change.

While the above techniques of setting and maintaining operating current in the master and slave bus line drives have met with substantial success, the techniques are not without certain shortcomings. For example, the technique of setting the current in the master requires an extra pin dedicated to receive the external resistor. Another shortcoming is selecting the proper value of the external resistor to maintain the factor of two scaling between $(V_{term}-V_n)$ and $(V_{term}-V_{out})$. If the scaling is not precisely set, the output swing is not symmetric about $V_{ref}$. Further, as process, voltage, or temperature variations occur, the value selected for the resistor may not be ideal. A further shortcoming is that an electrostatic discharge structure (ESD) in series with the pin receiving the external resistor adds a variable amount of resistance in series with the external resistor. This makes the selection of the external resistance subject to variations in the ESD structure.

Further, a shortcoming in the technique of setting the current in the slave is that a relatively complex algorithm between the slave and the master is required to correctly set the current in the slave. The master sets the RC time constant which in turn determines the count and the output value. The master then tests the output value to determine whether it matches $V_{ref}$. If not, it increases the count and retests the output value. This cycle continues until a match occurs. However, a match of $V_{out}$ to $V_{ref}$ for one bus line, does not always insure that a match will occur on another bus line due to small differences in characteristics between output drivers, bus lines, and $V_{ref}$ comparison circuits.

As can be seen, an improved output driver circuit and techniques for obtaining rapid switching speed with low power consumption and low noise is needed.

SUMMARY OF THE INVENTION

The present invention includes a circuit and current control technique to enable high-speed buses with low noise. This circuitry may be used in the interfacing of high-speed dynamic RAMs (DRAMs). The architecture of the present invention includes the following components: an input isolation block (Isolation), an analog voltage divider (AVD), an input comparator, a sampling latch, a current control counter, and a bitwise output driver (output driver A and output driver B).

A fundamental operation of the current control mechanism is to evaluate the voltage levels $V_{hi}$, $V_{low}$, and $V_{ref}$, and increment or decrement the current control counter accordingly to set an appropriate output level. When the current control circuitry is in an evaluation mode, output driver A is off (not sinking current), and node BDA is at the output high voltage level (typically $V_{term}$). Output driver B is active, and pulls node BDB to the low voltage output level. The voltage levels at nodes BDA and BDB are passed through the isolation block, and fed into the analog voltage divider. The analog voltage divider outputs a voltage level which is a weighted average of it's input. I.e., $V_{out}=(A*V_{hi})+(B*V_{low})$. For example, in a specific case, $V_{out}=(0.5*V_{hi})+(0.5*V_{low})$.

The input comparator compares $V_{out}$ and $V_{ref}$ and generates an up signal. The up signal is sampled, and used to increment or decrement the current control value held in the current control counter. By repeating this process the current control value will settle to a value where $Vol=(V_{ref}-A*V_{term})/B$.

When the current control circuitry is not active, the input isolation block shields any interactions of the analog voltage divider circuitry and the output pad.

The output driver is composed of a series of individual output transistors, an example of which is shown in FIG. 4. The number of active output transistor blocks are selected with control signal ictrl[n:O]. The width of the output devices may be scaled in a geometric fashion to allow encoding of the ictrl[n:O] signal.

The input isolation gates may be implemented as CMOS pass gates, NMOS passgates with boosted gate voltages, unity gain buffers, or operational amplifiers (op amps). The analog voltage divider may be implemented with a resistor divider, a digital-to-analog converter, or switched capacitor filter such as a sigma/delta modulator. The sampling latch may be implemented as a simple flip-flop or latch, or a series of sequential elements with logic to average the sampled value. The current control counter may be implemented as an up-down counter or a more sophisticated counter such as a saturating binary search counter.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
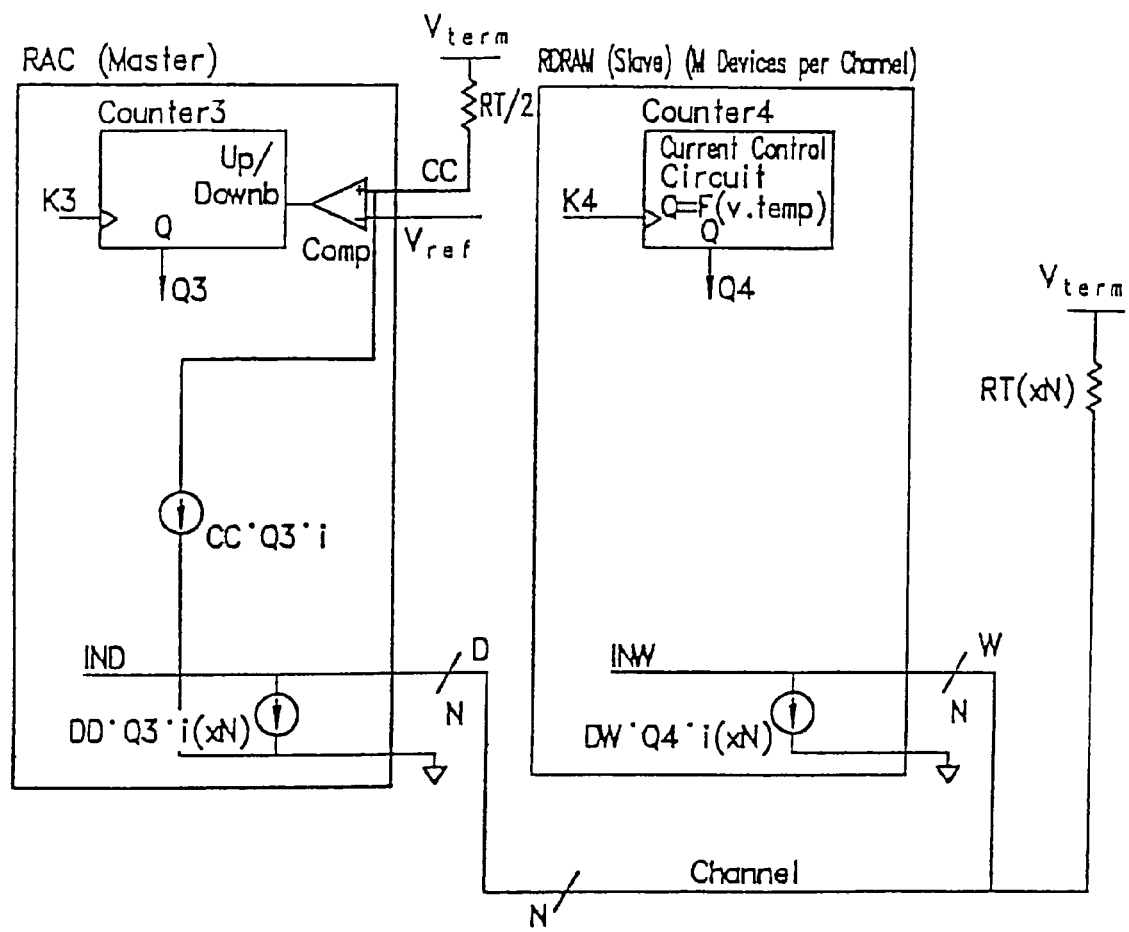
FIG. 1 illustrates a prior art implementation of a current control circuit having a master device and slave device.

The present invention provides an improved apparatus and method of setting the current in master and slave devices connected to a common bus. FIG. 1 is a block diagram of a current control implementation with a master device (RAC) and a slave device (RDRAM), in accordance with the prior art FIG. 1 is simplified to display only a single slave device RDRAM, however it should be appreciated that many slave devices may be used in connection with the master device RAC.

In accordance with the prior art, the master device RAC has a dedicated output pin CC. The output pin CC is connected to a termination voltage $V_{term}$ through a resistor $R_{term}/2$. If the output driver is an ideal current source, then the voltage output will be the middle of the swing. This value is compared to $V_{ref}$ and adjusted up or down accordingly.

For the slave device RDRAM, there is a circuit that indirectly infers the amount to adjust the output current depending on variations of voltage and temperature. The original proper value is established by running a current control initialization routine which requires reading data back through the master device and detecting the first time valid ones are transmitted on the bus. This threshold is discovered and then doubled (approximately) before being sent to the slave device.

The technique shown in FIG. 1 requires N+1 pins on the master device, and N pins on the slave device. The additional pin on the master device is required for the CC connection shown in FIG. 1. The device of FIG. 1 also requires the resistor RT/2 on the printed circuit board upon which the master device is mounted. Unfortunately, the RT/2 resistor may not have the desired value. The current produced by the output transistor varies slightly as the voltage changes, which means there are non-ideal effects of the V-I characteristics of the output transistor, such as channel length modulation. So although it is desirable for the current control resistor to be $R_{term}/2$, its value is more likely about $R_{term}/2.2$. The value also varies somewhat due to differences in process, vendor, and temperature.

Internal to the master device RAC, there is an input comparator COMP. The comparator compares $V_{ref}$ to the voltage on the current control pin (CC). If the voltage comparison determines the output is too low, then a counter (Counter3) is incremented, thereby increasing the current of all the output drivers on the chip (during the next current control cycle). If the current is too high, then the counter (Counter3) is subsequently decreased. By selecting the proper resistor (which is difficult to do), the current control circuit adjusts the output drive at regular intervals to keep the full voltage swing of the remaining pins. This then tracks any drift of the transistors due to voltage or temperature effects, allows for different process variations chip to chip, and provides many similar benefits. However, selecting the proper resistor value to achieve this result is difficult.

A further technique involves using an expansion mechanism referred to as "y-channel." However, this technique requires that the resistor value be changed (essentially halved) when the module is inserted, compared to the case when it is not inserted. This may be achieved by adding a parallel current control resistor to the one on the motherboard which essentially changes the parallel resistance so that the output current is doubled. Unfortunately, the non-linear nature of the transistors again requires that a "special" resistor value be calculated in order to double the current. Once the proper resistor value is found, automatic tracking is still assured using the expansion mechanism.

A consideration that needs to be addressed for some integrated circuits is that an electrostatic discharge (ESD) structure may be placed in series with the current control pin. This adds a variable amount of resistance, significant enough to change the needed external resistor value substantially. The resistance of such an ESD structure needs to be accounted for.

As known in the art, current control calibrations are performed during "quiet" times on the bus. That is, the current control calibrations are "scheduled" between activities on the bus.

Figure 2:
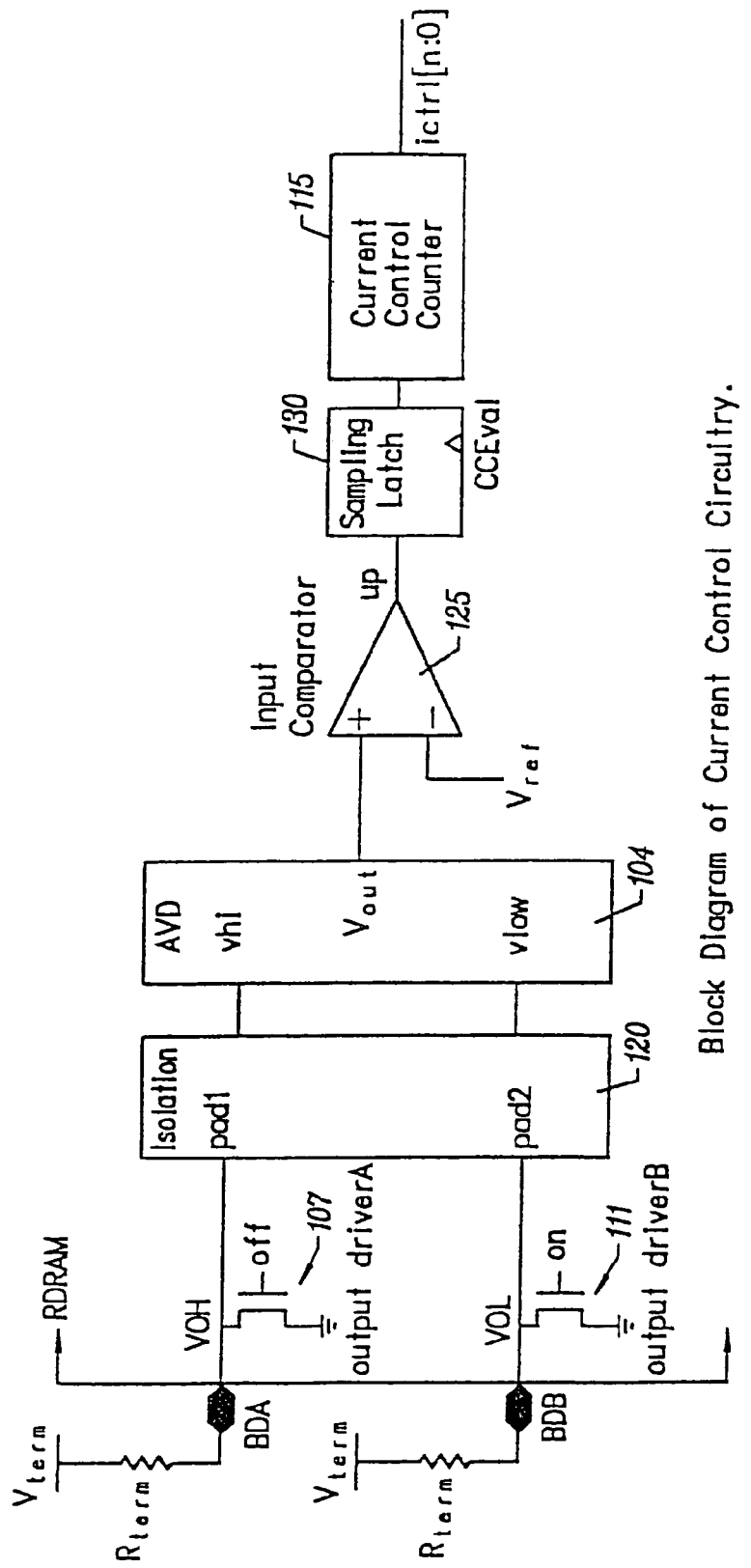
FIG. 2 shows a block diagram of current control circuitry in accordance with an embodiment of the present invention.
Figure 3:
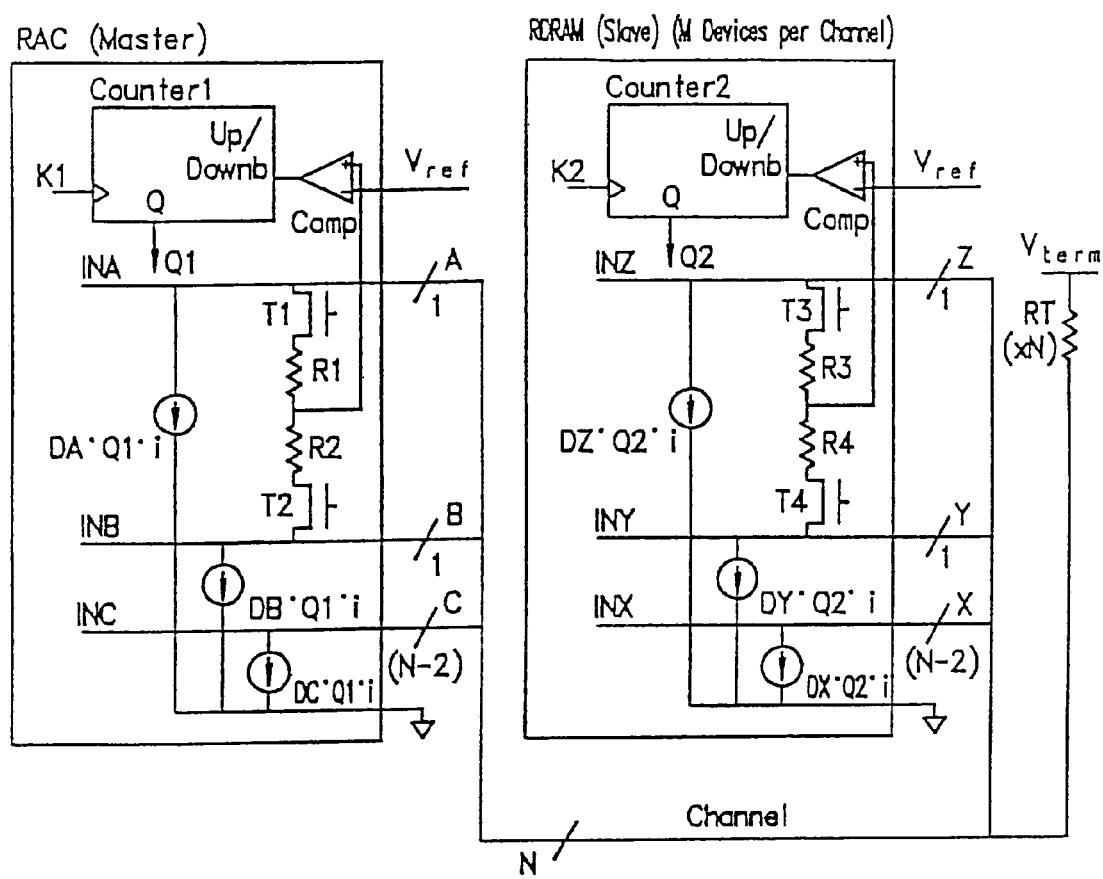
FIG. 3 illustrates current control circuitry in accordance with an embodiment of the present invention.
Figure 4:
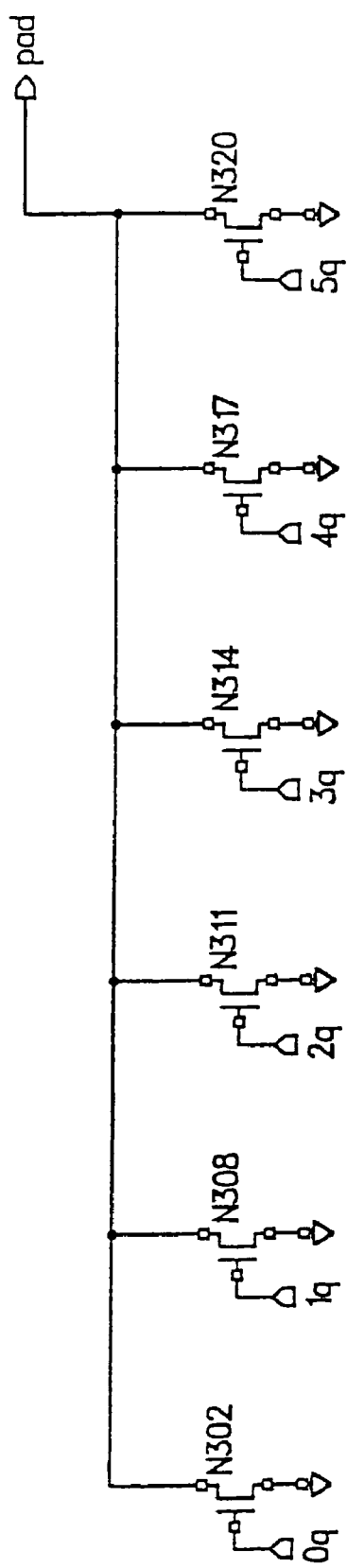
FIG. 4 illustrates an output driver which may be utilized in accordance with an embodiment of the invention.

FIG. 2 shows an overall diagram of an embodiment of the current control technique of the present invention. FIG. 3 is a schematic of the architecture utilized in accordance with the invention. FIG. 4–8 show circuit schematics of a specific implementation of the present invention.

The circuit of FIG. 2 includes the following components: an input isolation block (Isolation) 120, an analog voltage divider (AVD) 104, an input comparator 125, a sampling latch 130, a current control counter 115, and a bitwise output driver (output driver A 107 and output driver B 111).

As shown in connection with FIG. 1, the prior art relied upon an input comparator COMP in performing its current control functions. The present invention also uses an input comparator 125 for current control functions. However, unlike the prior art which received a control voltage from a dedicated external pin connected to a printed circuit board mounted resistor RT/2, the present invention uses a simple R over R resistive divider placed between an active output and a nonactive output. The output of the divider circuit is a voltage equal to $(V_{term}-V_{swing})/2$. This is exactly the value desired to compare against $V_{ref}$. It is desirable that these two are equal. If they are not, the current control circuit increments or decrements the counter and tracks any output current variations due to changes in current drive of the transistors (because of temperature or VDD changes).

The circuitry employs voltage divider circuitry 104 on both the master and slave devices. As shown in FIG. 2, the voltage divider circuitry is connected between bus drivers A and B, driver 107 and 111, respectively. This circuitry is activated when the operating current must be set in the bus drivers and deactivated when the bus drivers are used in normal operation.

Bus lines connected to the two selected drivers of the master are different from bus lines connected to the two selected drivers of the slave device. Consequently, the setting of an operating value of current in the master can proceed simultaneously with the setting of a value in the slave. If there are multiple slaves, each slave device may use bus drivers connected to a unique pair of bus lines so that the setting of the operating current in the several slaves may proceed concurrently. Preferably, all slave devices use the same pins.

A counter (e.g., 115) in the master and in the slave determines the value of the current in the current driver as discussed above. The count in the master and slave is determined by a feedback circuit which compares a voltage reference, $V_{ref}$, to a common node voltage, $V_{out}$, which is derived from the voltage divider circuitry. The feedback circuit assures, via the counter, that $V_{ref}$ is equal to $[V_{term}-(V_{term}-V_{out})/(1+\text{voltage divider ratio})]$ by adjusting current in a selected one of the drivers to which the voltage divider circuitry is connected. One of the drivers is left in the off condition, providing $V_{term}$ to the voltage divider. Thus, the common mode voltage swings a fixed amount equal to $(V_{term}-V_{ref})$ which is applied across the upper one of the resistors, R1 (FIG. 3), of the voltage divider when a resistive voltage divider is used. The lower one of the resistors, R2 (FIG. 3), has $g*(V_{term}-V_{ref})$ across it, where g is the voltage divider ratio. I.e., $g=R2/R1$ where R1 is connected between the off driver and the center node and R2 is connected between the center node and the on driver. Typical values for R1 and R2 are approximately 10 K ohms. Thus, $V_{out}$ equals $(1+g)*V_{ref}-g*V_{term}$. If the resistors are equal then g equals one and $V_{out}$ equals $2*V_{ref}-V_{term}$. For example, if $V_{term}$ is 1.8 volts and $V_{ref}$ is 1.4 volts, then $V_{out}$ is 1.0 volts and the swing, $V_{swing}$, of $V_{out}$ is 0.8 volts. Also, the current in the output driver is now $V_{swing}/R_{term}$, which equals 0.8 volts/28=28.6 milliamps. For example, $R_{term}$ may be about 28 ohms. Typically, $R_{term}$ may be in the range from about 20 ohms to about 50 ohms.

When the voltage divider circuit is activated, the circuit itself creates a source of voltage error, caused by the current that flows through the voltage divider circuit from $V_{term}$, through the termination resistor, through R1 and R2 and to the output driver which is in the on-state. This current causes the voltage of the driver in the off-state to be slightly less than $V_{term}$, say $e*V_{term}$, where e is a number close to one. Specifically, $e=1-[((V_{term}-V_{out})N_{term})*(R_{term}/(R1+R2+R_{term}))]$. This current also causes the voltage of the driver in the on-state to be slightly higher than $V_{out}$ also by the same error term, say $e*V_{term}$. Therefore, using the suggested resistor values, $e=0.998882$ and $V_{out}=1.002$, so $V_{out}$ has a 2 millivolt error.

The feedback circuit assures that the common node of the voltage divider is locked to $V_{ref}$, so that the drop across R1 is $(e*V_{term}-V_{ref})$. The voltage drop across R2 is $e*V_{term}-V_{ref}$. The output voltage, $V_{out}$, is $2*V_{ref}*V_{term}$. So the output voltage is slightly higher than its value in the absence of the voltage divider. $V_{swing}$ is now $(1+e)V_{term}-2*V_{ref}$ and the current in the output driver is $V_{swing}/R_{term}+(V_{term}-e*V_{term})/R_{term}= 2*(V_{term}-V_{ref})/R_{term}=30$ milliamps, as before. Thus, while the output voltage is altered slightly when the voltage divider circuit is activated, it does not affect the setting of current in the output driver or the counter value that controls that current.

Under ideal conditions the ratio of the resistors, g, is a precise value, such as unity. However, if some errors are present in the circuit, it is desirable to compensate for them by slightly altering the ratio. Some sources of error are currents into the comparator and hysteresis or offsets in the comparator. Another source of error is the circuitry used to activate the voltage divider circuitry, if the activation circuitry is in the form of pass gates in series with R1 and R2 of the voltage divider.

Alternatively, the error current that flows in the divider circuit may be negligible compared to the amount of current controlled by one half of the least significant bit of the counter, if the resistances in the divider can be made large enough. The value of $(V_{term}-e*V_{term})/R_{term}$ is approximately 0.15 milliamps. The amount of current flowing through the voltage divider is $[(V_{term}-V_{out})/(R1+R2+R_{term})]$ or typically about 0.04 mA. Seven bits controlling 28.6 milliamps makes 1/2LSB equal to 0.11 milliamps.

Another reason for altering the ratio, g, is that the edge rate for a rising signal may be different from a falling signal on the output of the bus driver. Altering the voltage divider ratio so that the swing is not symmetric about $V_{ref}$ may be necessary to obtain the best noise margin for receiving the signal on the bus.

In one embodiment the relationship between the counter value and the current in the driver is linear. Such a driver uses binary weighted output transistor legs to adjust the current in single steps from 0 to $2^N$ where N is the number of current control bits. In other embodiments there are other relationships between the counter value and current in the driver. For example, a logarithmic relationship can be used. This allows more precision with smaller count values and less precision with larger count values.

In another embodiment, the counter counts up until the proper current is reached. After the initial setting, the counter counts up or down to adjust the current in the driver. In another embodiment, more complex algorithms are employed to find the correct value for the count. One such algorithm is binary searching until a value close to the correct value is found and then counting up or down to obtain the precise value.

In a further embodiment, the feedback and counter circuit setting apply to all of the bus drivers of a device. In another embodiment there is a feedback and counter circuit for each or any number, 1-to-N, of the bus drivers of a device. This latter embodiment has the advantage that each driver is correctly set, but the disadvantage that more circuitry is required.

The setting of operating current in the bus driver can consume time on the bus, resulting in a loss of throughput. To eliminate this loss, in one embodiment, the setting of the current occurs during a period of time on the bus which cannot be used otherwise. If the slave devices are memory devices, that time is the time at which the memory devices are refreshed, which typically occurs every 16 microseconds for a duration of 80 ns. In some cases the setting of the operating current in the bus driver takes only about 20 ns, thus, the setting can occur concurrently with the refresh operation.

Figure 6:
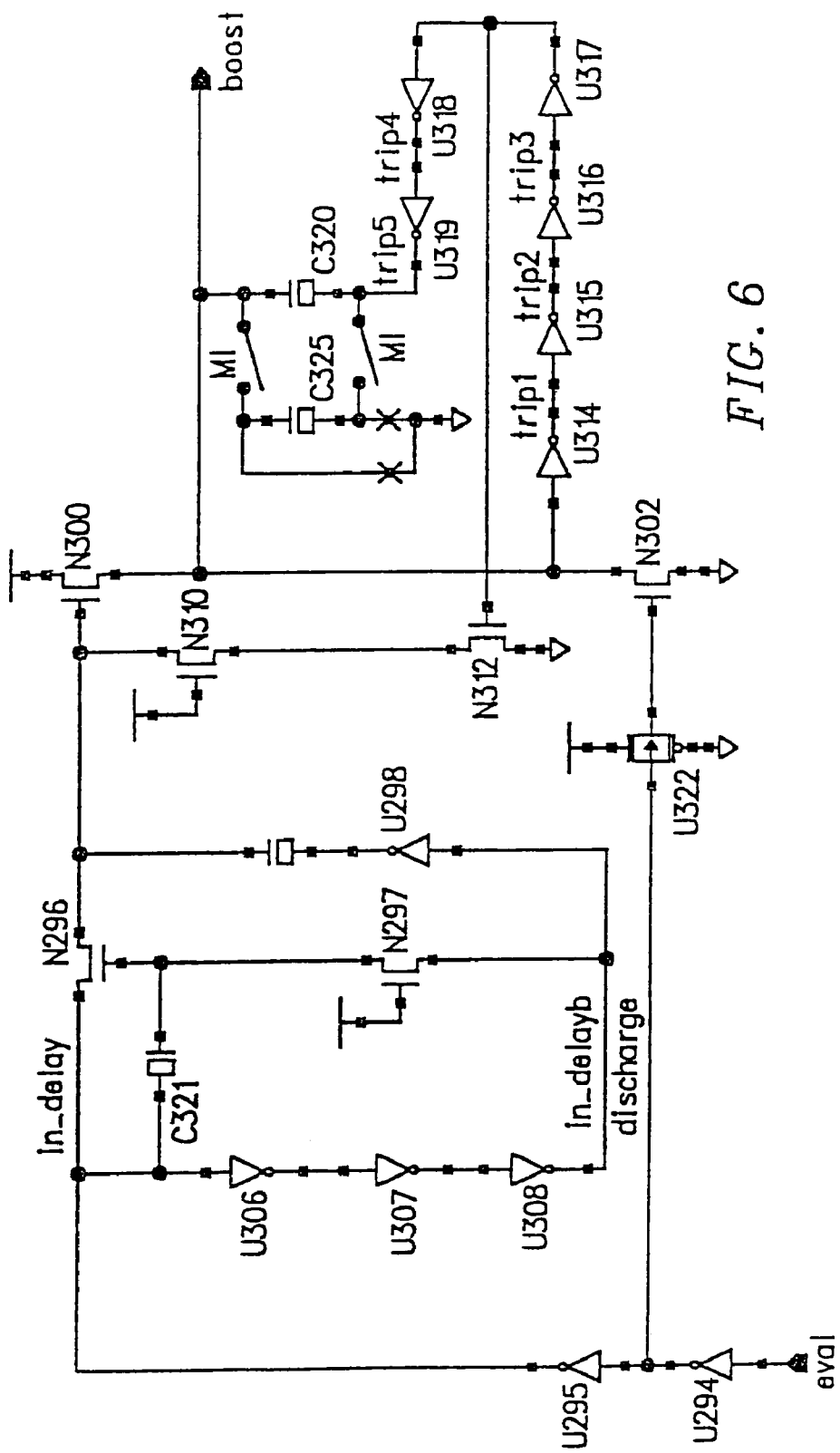
FIG. 6 shows circuitry for the gxCCbst1 element of FIG. 5, which may be used to generate a boosted voltage.
Figure 7A:
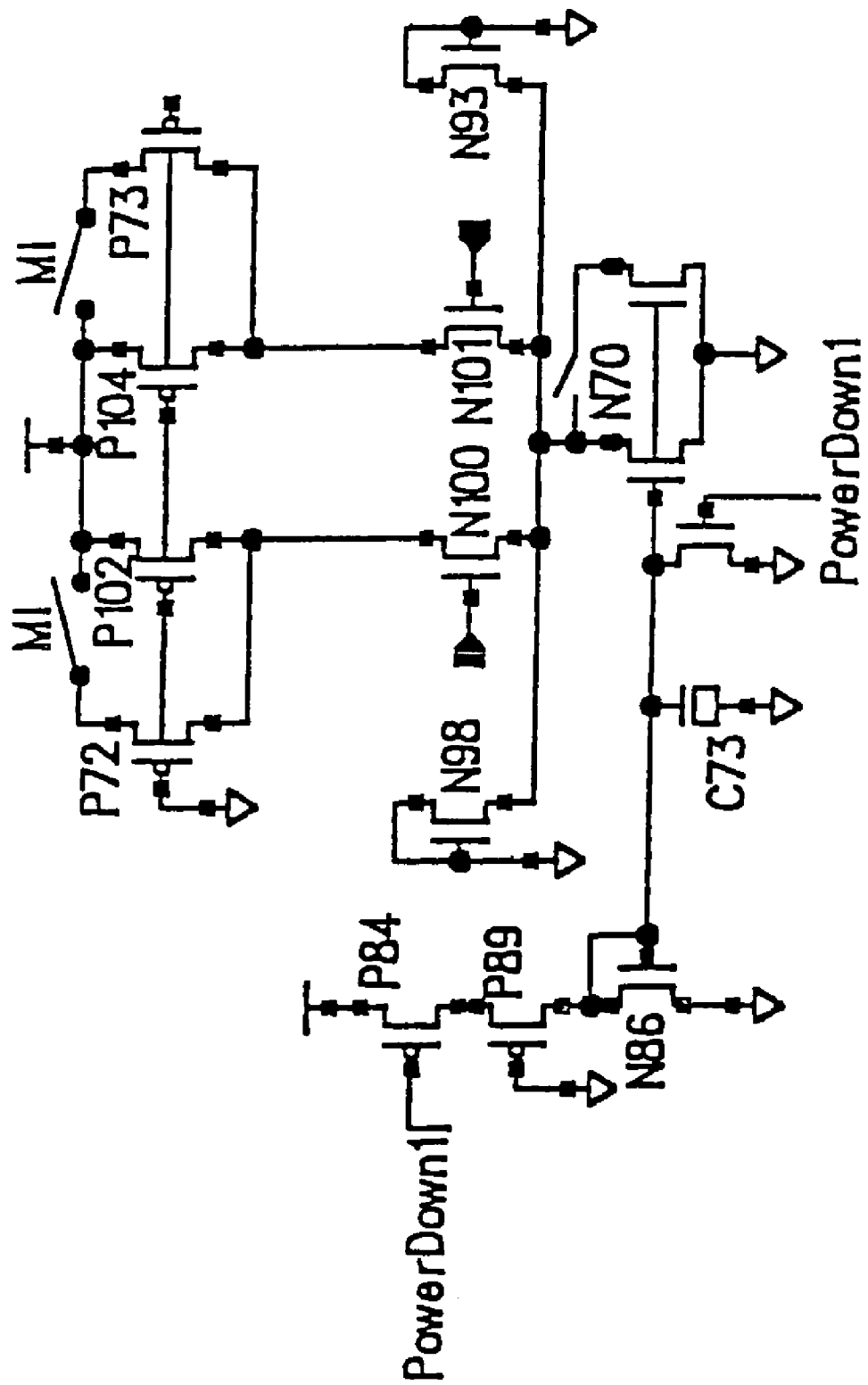
FIG. 7A–7B shows circuitry for an input comparator gxCComp of FIG. 5.
Figure 7B:
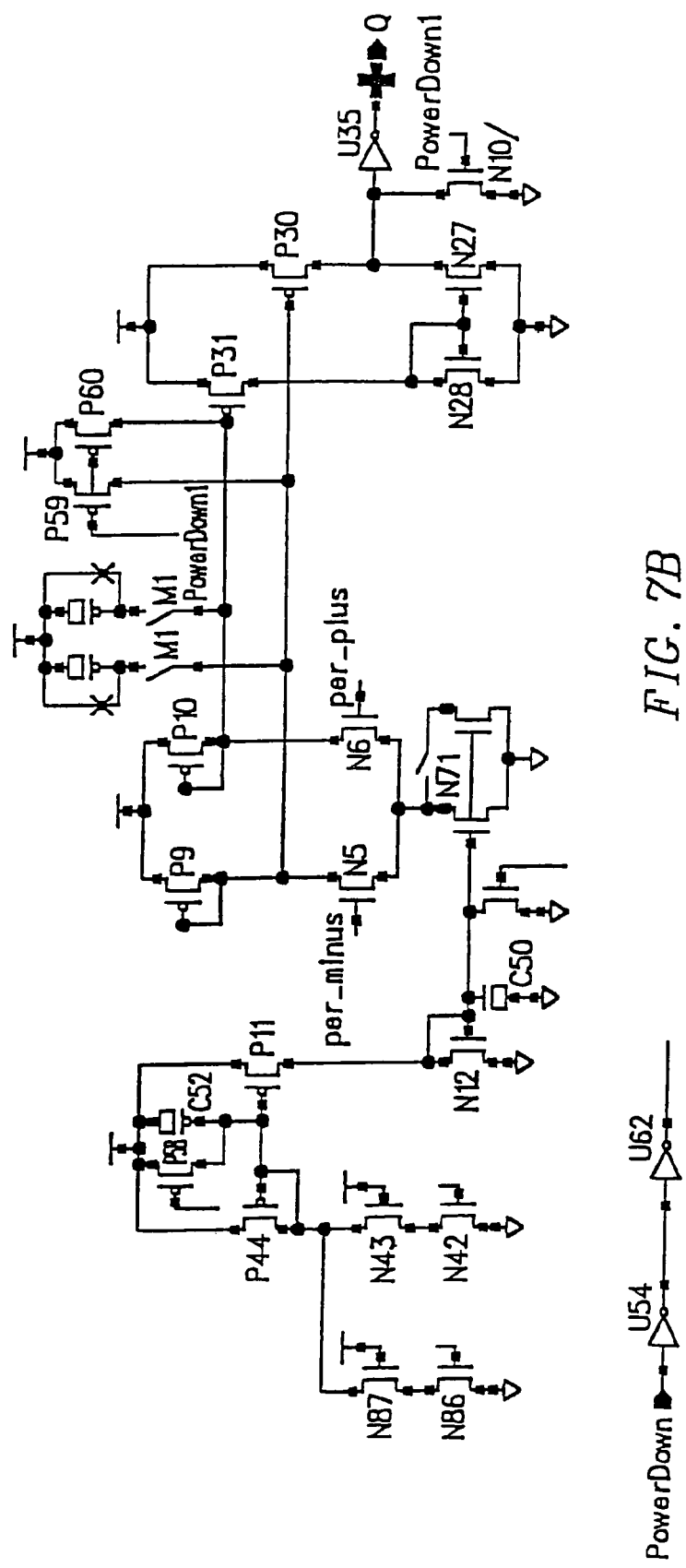
Figure 8:
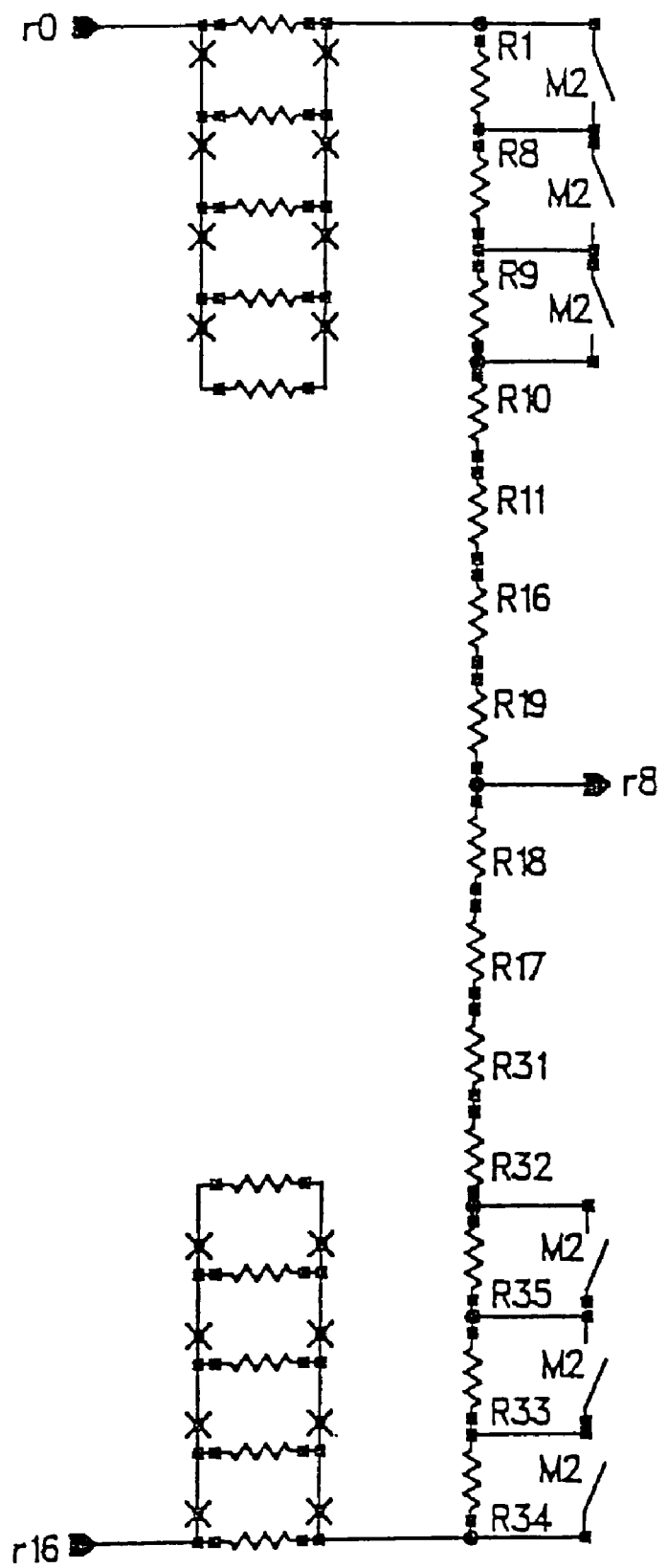
FIG. 8 shows a resistor divider implementation for gxCCDiv0 of FIG. 5.

Connected to the voltage divider circuitry is a means for coupling the divider circuitry to the output lines to which it is attached. In one embodiment the means for coupling is simply a wire attached between the voltage divider circuitry and the output lines. In an alternate embodiment the means for coupling is composed of a CMOS pass gate which serves to isolate the voltage divider circuitry from the output lines to which it is attached when the current control circuitry is not enabled. In another embodiment the means of coupling is an NMOS pass gate with boosted gate voltages. A typical circuit to generate the boosted gate voltage level is shown in FIG. 6.

Other embodiments employ unity gain buffers, operational amplifiers, transconductance, or sample-and hold circuitry to couple the voltage at the output lines with the voltage divider. Still other embodiments employ capacitors to couple a difference voltage from the output lines to the voltage divider, such as in some switched capacitor filters.

While the above discussion referred to a resistance voltage divider, other embodiments for dividers include the use of digital to analog converters or switched capacitor filters such as a sigma/delta modulator. An analog-to-digital converter may be used to convert the analog input voltage and/or Vref values to a digital value. Subsequent division and comparison may then be performed by digital signal processing.

The output value from the voltage divider circuitry is compared to a voltage reference value. The comparator may be a simple analog differential voltage comparator shown in FIGS. 7A and 7B. In an alternate embodiment, the comparator may also be a regenerative sense-amp circuit. The comparator may also be a switched capacitor filter. In still another embodiment where an analog-to-digital converter is used as a voltage divider, the comparator may be a digital signal processor.

Preferably, the reference voltage is provided from an external pin. However, the reference voltage may also be generated with a band-gap reference circuit, or a voltage divider of Vdd or another voltage supply.

Figure 5:
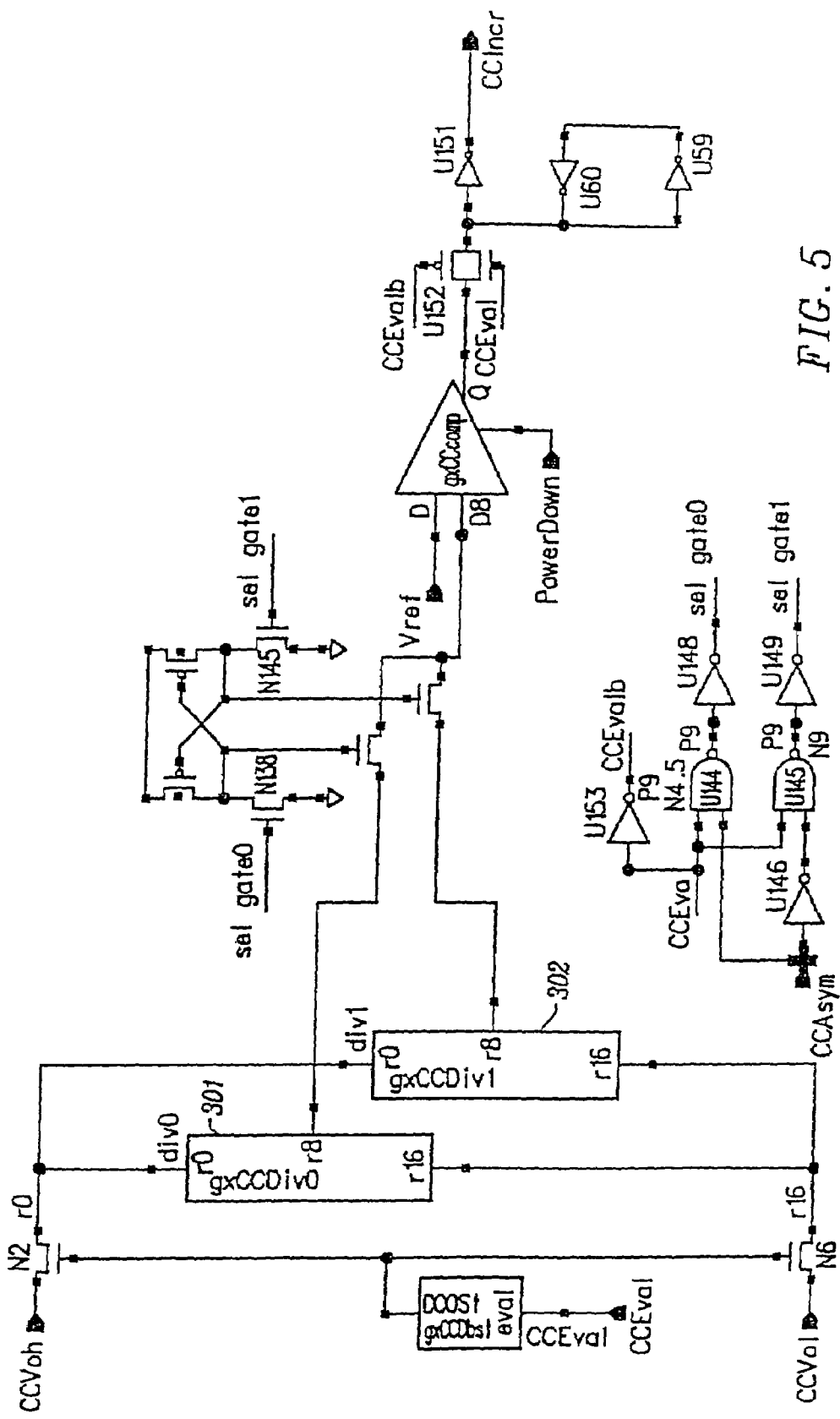
FIG. 5 is a detailed illustration of an implementation of the current control circuitry of the invention.
Figure 9:
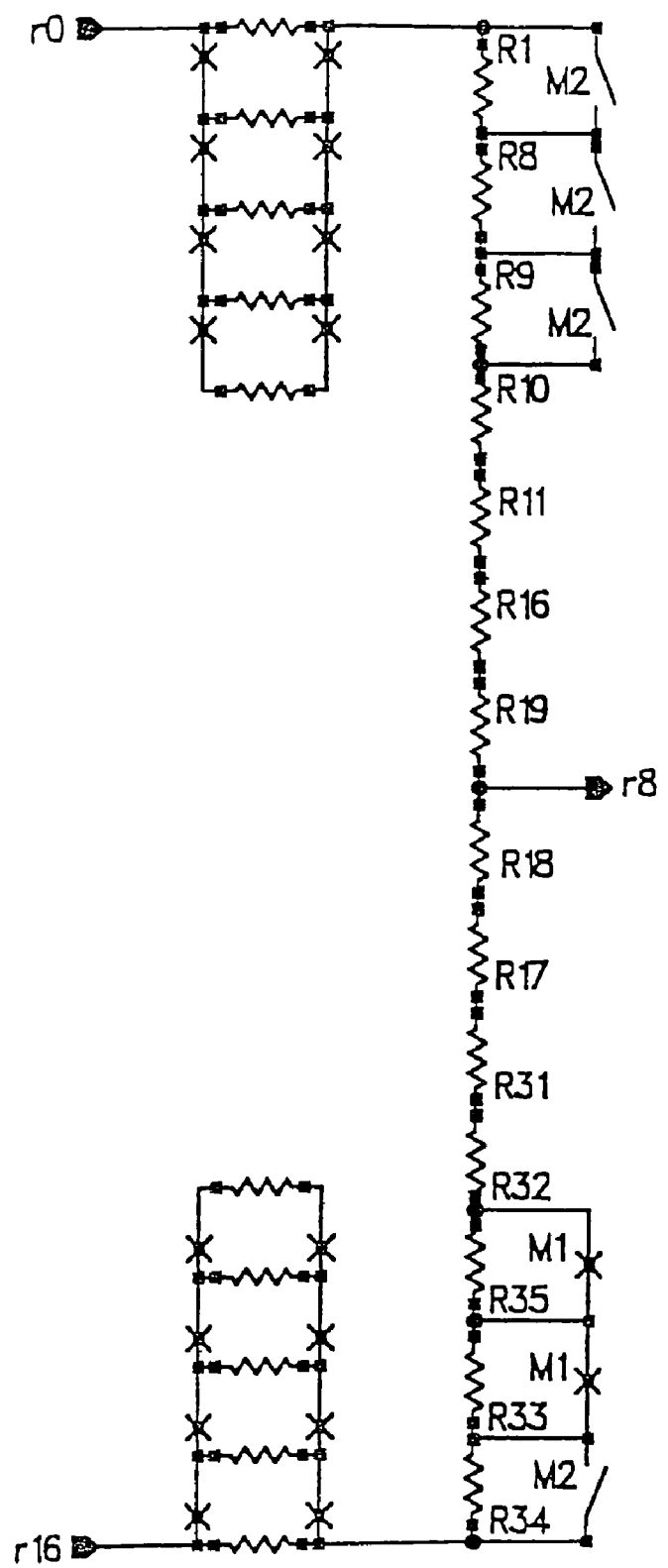
FIG. 9 shows a resistor divider implementation for gxCCDiv1 of FIG. 5.

Preferably, two voltage divider ratios are selectable. For example, FIG. 5 illustrates two voltage divider devices 301 and 302 that may be alternately selected. The actual voltage divider circuits may be implemented resistive ladders of the type shown in FIGS. 8 and 9.

In some embodiments, a sampling latch may be employed between the output of the comparator and the up-down counter. The sampling latch functions to average the output of the comparator so that the jitter on the counter is reduced.

The invention does not require the CC pin and external resistor shown in the prior art device of FIG. 1. The invention also provides better tracking than the device of FIG. 1. For FIG. 1, a fairly complex, and somewhat unwieldy current control initialization algorithm is required to find the proper start value for each slave device. However, with the present invention, implementing the current control scheme eliminates the need for complex initialization as each slave device automatically adjusts its own output to proper swing levels. Slave devices are instructed on a regular but infrequent basis to check the outputs. This may be accomplished during the same time a master device performs its calibration.

For the master device, the benefits of the present invention include the elimination of the CC pin and output driver and greater accuracy of setting the proper current swing. Estimates show that by implementing the current control technique of FIG. 2, an increase in voltage margin yields about 7 OMHz of additional timing margin.

Moreover, for the technique of the present invention, there is no need for current control resistors on y-channel modules. However, the technique is also backwards compatible for modules that currently have such resistors.

Furthermore, the slave device automatically adjust its swing and monitors the current to adjust for variations in output drive due to voltage and temperature variations. Also, each slave device finds its own current control value depending on the process variations of the individual component.

The benefits of the present invention for the slave device include better swing accuracy (related to a similar benefit for the master device), elimination of the existing current control tracking logic in the slave device, and elimination of the current control initialization routine described in U.S. Pat. No. 5,254,883.

For the master device, two pins are used for current control adjustment. One pin is driven to a logic one (low voltage) and the other pin is not driven. The time this is done is under control of the control logic within the ASIC. The slave device is done at the same time, using different pins (for driving) than the master device is using. During this operation, a resistive divider is inserted between two pins, using pass transistors T1 and T2. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search can be implemented, followed by a simple adjust one up or down once the algorithm is completed. Such an embodiment is complicated, the savings of time to find the necessary set point may not justify elimination of a simple up/down counter.

For the slave device, two pins are used for current control adjustment. One pin is driven to a logic one (low voltage) and the other pin is not driven. This is done using a special register read command (or this could be done during a memory refresh to the same device). During this operation, a resistive divider is inserted between two pins, using pass transistors T3 and T4. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search could have been implemented, followed by a simple adjust one up or down once the algorithm is completed.

The new method use two of the N total pins, different pins for the master and the slave. During current calibration, one slave and the master both calibrate at the same time, on different pins.

Figure 10:
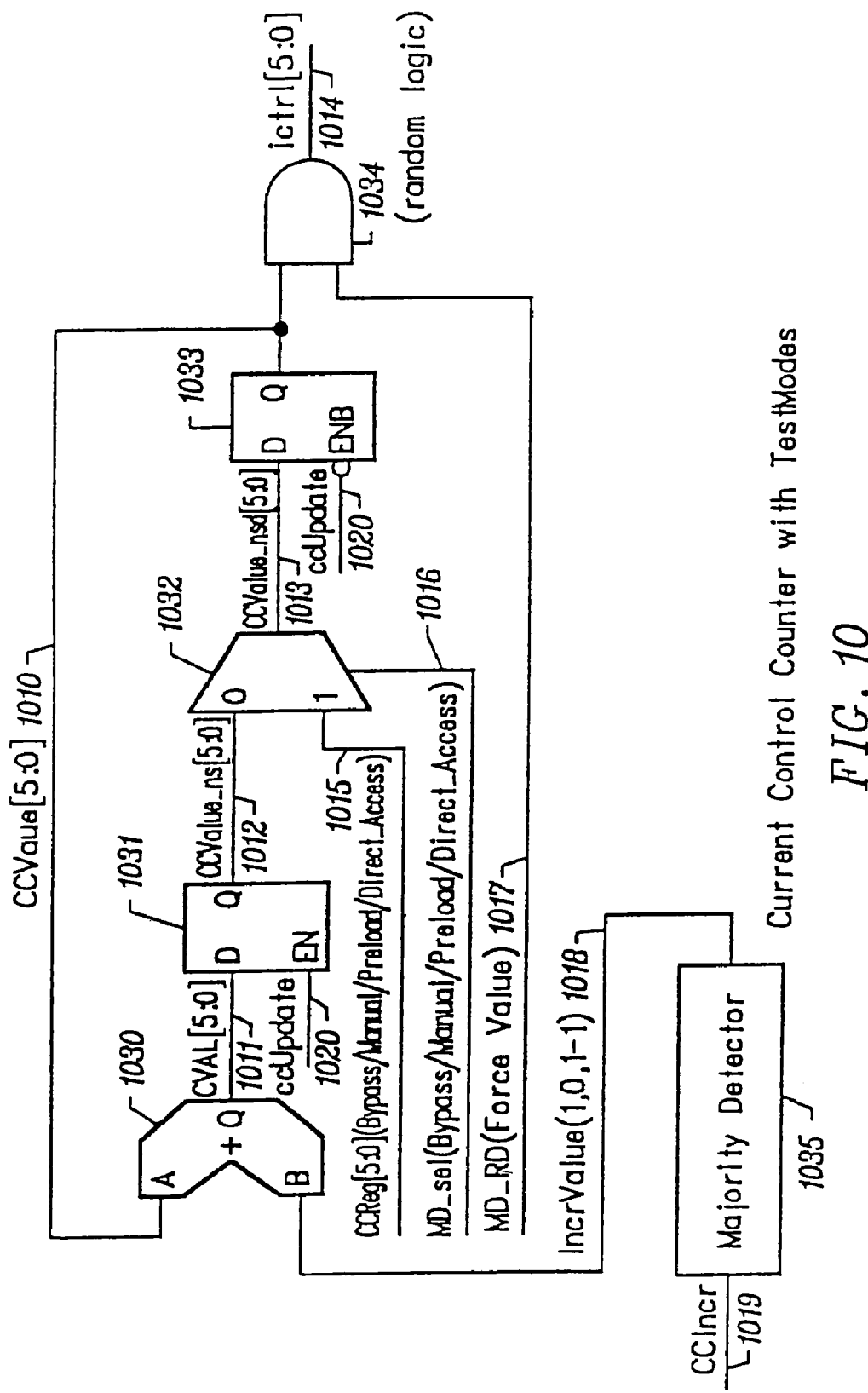
FIG. 10 illustrates control and test mode logic circuitry that may be used in accordance with an embodiment of the invention.

FIG. 10 illustrates control and test mode logic that may be used in connection with the invention. The current control counter includes an adder 1030, a master latch 1031, a multiplexer 1032, a slave latch 1033, random logic 1034, and a majority detector 1035. Using the control counter in FIG. 10, various modes of operations are possible. In a first mode, the circuitry is placed in an "auto mode" when MD_sel Bypass 1016 is deasserted and MD_RD 1017 is asserted. In the auto mode, CCValue_ns[5:0] 1012 is coupled to CCValue_nsd[5:0] 1013. Each ccUpdate 1020 pulse updates the current control value by one bit based on the Value IncrValue 1018 (which take values of 1, 0, or −1).

During initialization, a series of ccUpdate pulses will drive ictrl[5:] 1014 to approach its equilibrium value. Periodic updates may be done with subsequent ccUpdate pulses at specified intervals.

In a second mode, the circuitry is placed in a "manual mode" when MD_sel Bypass 1016 is asserted and MD_RD 1017 is asserted. In the manual mode, CCValue_nsd[5:0] 1013 is coupled to CCreg[5:0] 1015. At the low phase of ccUpdate, the value of ictrl[5:0] is loaded into CCReg[5:0] 1015. This mode may be used to drive an arbitrary ictrl[5:0] value, or to preload the master-slave flip flop (1033) before entering Auto mode. The same datapath is used during the Direct Access Test mode where test values of ictrl[5:0] are driven by changing CCReg[5:0]. A "mid" value of CCValue [5:0]=100000 may be preloaded at initialization so the equilibrium value is reached with fewer numbers of ccUpdate pulses.

The circuitry may also be placed in a "force mode" when MD_RD 1017 is de-asserted. In the force mode, a specific value may be forced at ictrl[5:0] when MD_RD 1017 is de-asserted. In the preferred embodiment, random logic forces ictrl[5:0]=101111. An alternate embodiment may implement a different forced value or values. This mode is used for testing and calibration.

The majority detector filters the value of CCIncr 1019 and prevents toggling of ictrl[5:0] when the value is within one bit of the settled value. The majority detector takes an even number of samples of Signal CCIncr. The IncrValue 1018 is "1" if the majority of samples are high. The IncrValue 1018 is "−1" if the majority of samples are low. The IncrValue 1018 is "0" if there is no majority.

Figure 11:
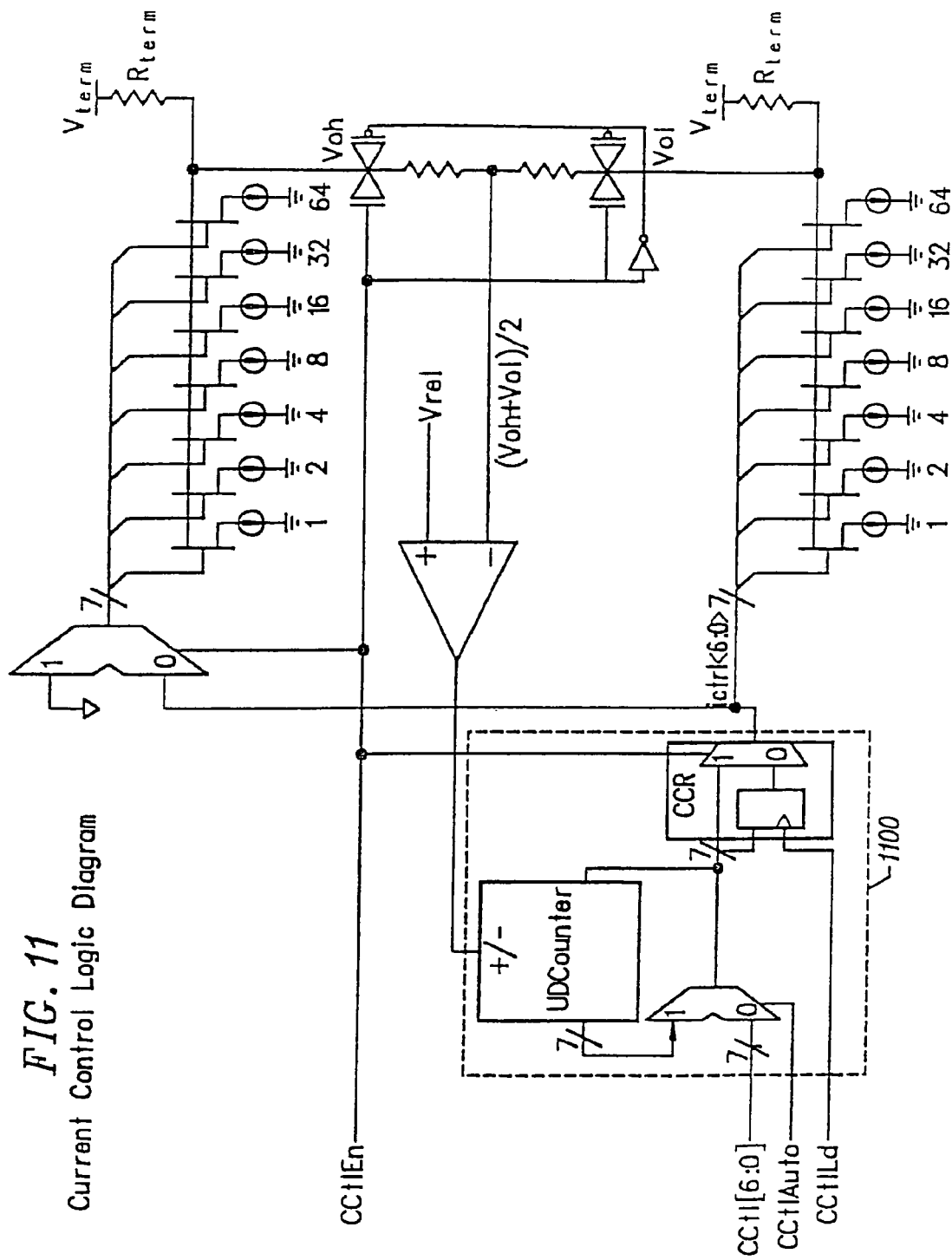
FIG. 11 illustrates a current control counter circuit that may be used in accordance with an embodiment of the invention.

FIG. 11 shows another embodiment of current control counter that may be used in accordance with the invention. This implementation uses a seven-bit ictrl value. The circuitry 1100 has three modes of operation. In a first mode, the circuitry is placed in an "auto-acquire mode" when CCtlEn is high and CCtlAuto is high. In the auto-acquire mode, the up-down counter is coupled to ictrl[6:0]. As the up-down counter is incremented or decremented, ictrl[6:0] is changed accordingly, until the equilibrium value of ictrl[6:0] is reached. At this point, the equilibrium value is loaded into CCR with signal CCtlLd, and the current control counter may enter Auto mode.

The circuitry may also be placed in an "auto mode" when CCtlEn is low and CCtlAuto is high. In the auto mode, the register in the CCR block controls the current setting of ictrl[6:0]. In this mode, the up-down counter is also coupled to the CCR register.

The circuitry also has a "manual mode" when CCtlEn is low and CCtlAuto is low. In the manual mode, a seven-bit value CCtl[6:0] is driven or stored into the counter and ictrl[6:0]. This mode is used to set a value into the counter and register that is close to the setting that will actually result in the auto-acquire mode, which cuts down on the time it takes to reach the equilibrium ictrl[6:0] value. This mode may also be used to set the counter and register to a certain value before the auto-acquire mode is entered. This mode may also be used as a test or direct access mode where specific values may be driven onto ictrl[6:0] by changing Cctl[6:0].

The current control circuitry may be implemented with a single output pin to perform current calibration. Both "high" and "low" voltage values are measured from the same pin sequentially with sample-and-hold circuitry. Subsequent processing of these voltage values are averaged with a voltage divider.

In another embodiment, the pin voltage values are measured during normal operation of the RDRAM. Based on data of the DRAM "read" operations, the current control circuitry determines when stable output "high" or "low" voltage patterns are present on the pin. A single pin or multiple pins may be used to measure the pad voltage. Multiple samples and averaging may be performed to filter noise coupling and reflection on the output channel from the stable output "high" and "low" levels. This embodiment has the advantage of requiring no "quiet period" on the channel for current control calibration.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A system including an integrated circuit memory device, the integrated circuit device comprising:
    a register to store a value representative of an output voltage setting;
    a circuit that holds a value representative of an adjustment to the output voltage setting; and
    an output driver to output a drive voltage during a calibration operation, wherein a signal is generated based on a comparison between a signal derived from the drive voltage and a reference voltage, the signal to update the value representative of the adjustment to the output voltage setting,
    wherein the circuit that holds the value representative of the adjustment to the output voltage setting includes a counter, wherein:
    the output voltage setting is adjusted in a first direction when the drive voltage exceeds the reference voltage; and
    the output voltage setting is adjusted in a second direction when the reference voltage exceeds the drive voltage.

2. The system of claim 1, further comprising a controller device that controls the integrated circuit memory device, wherein the value representative of the output voltage setting is provided to the integrated circuit memory device by the controller device.

3. The system of claim 1, further including:
    a divider circuit coupled to the output driver to generate the signal derived from the drive voltage by dividing between a predetermined voltage and the drive voltage; and
    a comparator circuit to receive the reference voltage and the signal derived from the drive voltage, the comparator to generate a signal which indicates which direction to adjust the output voltage setting based on the comparison.

4. The system of claim 1, further including a controller device, coupled to the integrated circuit memory device, the controller device to provide a command that initiates the calibration operation.

5. The system of claim 1, wherein the output driver includes a plurality of transistor legs, and wherein select transistor legs of the plurality of transistor legs are activated based on the value representative of an output voltage setting.

6. The system of claim 1, further including a pin on the integrated circuit memory device, the pin to receive the reference voltage.

7. The system of claim 1, further including a controller device coupled to the integrated circuit memory device, wherein the value is stored in the register in response to a signal that indicates manual loading of the register, and wherein the signal that indicates manual loading of the register is provided to the integrated circuit memory device by the controller device.

8. The system of claim 1, further including a circuit to generate the reference voltage.

9. A system including an integrated circuit memory device, the integrated circuit device comprising:
    a register to store a value representative of an output voltage setting;
    a circuit that holds a value representative of an adjustment to the output voltage setting; and
    an output driver to output a drive voltage during a calibration operation, wherein a signal is generated based on a comparison between a signal derived from the drive voltage and a reference voltage, the signal to update the value representative of the adjustment to the output voltage setting;
    a divider circuit coupled to the output driver to generate the signal derived from the drive voltage by dividing between a predetermined voltage and the drive voltage; and
    a comparator circuit to receive the reference voltage and the signal derived from the drive voltage, the comparator to generate a signal which indicates which direction to adjust the output voltage setting based on the comparison,
    wherein the divider circuit and the comparator circuit are included on the integrated circuit memory device.

10. A memory system comprising:
    a register, disposed on an integrated circuit memory device, to store a value that is representative of an output driver setting;
    an output driver, disposed on the integrated circuit memory device, to drive an output signal;
    a counter, having a count value, to calibrate an output voltage swing of the output driver during a memory refresh period; and
    a comparator to update the count value based on a comparison between a reference voltage level and a voltage level derived from the output signal, wherein the count value modifies the output voltage swing of the output driver during the memory refresh period.

11. The memory system of claim 10, further including a circuit to derive the voltage level from the output signal by dividing between a termination voltage level and a voltage of the output signal.

12. The memory system of claim 10, wherein the output voltage swing is calibrated periodically.

13. The memory system of claim 10, wherein a command is provided to the integrated circuit memory device that instructs the integrated circuit memory device to calibrate the output voltage swing.

14. The memory system of claim 10, wherein the count value is loaded into the register in response to a signal, wherein the count value becomes the value stored in the register.

15. The memory system of claim 10, wherein output driver includes a plurality of transistor legs, and wherein a transistor leg in the plurality of transistor legs is activated based on the count value.

16. The memory system of claim 10, wherein the reference voltage level is provided to the integrated circuit memory device.

17. The memory system of claim 10, wherein the reference voltage level is presented on the integrated circuit memory device.

18. A system comprising:
a register, disposed on an integrated circuit memory device, to store a value that is representative of an output voltage setting;
an output driver, disposed on the integrated circuit memory device, to drive a voltage level in accordance with the output voltage setting;
a comparator to provide a signal that indicates a direction to adjust the output voltage setting based on a comparison between a reference voltage level and a signal derived from the voltage level; and
a counter, having a count value, to adjust the output voltage setting in response to the signal that indicates the direction to adjust the output voltage setting,
wherein a command is provided to the integrated circuit memory device, and wherein the output driver drives the voltage level in response to the command.

19. The system of claim 18, wherein the signal derived from the voltage level is derived by dividing between a predetermined voltage level and the voltage level.

20. The system of claim 18, wherein the reference voltage level is presented on the integrated circuit memory device.

21. The system of claim 18, wherein output driver includes a plurality of transistor legs, and wherein a transistor leg in the plurality of transistor legs is activated based on the output voltage setting.

22. The system of claim 18, wherein the register is coupled with the counter to load the register with the count value.

23. A system comprising:
a register, disposed on an integrated circuit memory device, to store a value that is representative of a output voltage setting;
an output driver, disposed on the integrated circuit memory device, to drive a voltage level in accordance with the output voltage setting;
a comparator to provide a signal that indicates a direction to adjust the output voltage setting based on a comparison between a reference voltage level and a signal derived from the voltage level; and
a counter, having a count value, to adjust the output voltage setting in response to the signal that indicates the direction to adjust the output voltage setting,
wherein the signal that indicates the direction to adjust the output voltage setting is a binary signal that assumes first and second states, and wherein:
the first state indicates an increase to the output voltage setting; and
the second state indicates a decrease to the output voltage setting.

24. A system comprising:
a register, disposed on an integrated circuit memory device, to store a value that is representative of a output voltage setting;
an output driver, disposed on the integrated circuit memory device, to drive a voltage level in accordance with the output voltage setting;
a comparator to provide a signal that indicates a direction to adjust the output voltage setting based on a comparison between a reference voltage level and a signal derived from the voltage level; and
a counter, having a count value, to adjust the output voltage setting in response to the signal that indicates the direction to adjust the output voltage setting,
wherein the value is stored in the register in response to a signal that indicates manual loading of the register, and wherein the signal that indicates manual loading of the register is provided to the integrated circuit memory device.

25. A system comprising:
a register, disposed on an integrated circuit memory device, to store a value that is representative of a output voltage setting;
an output driver, disposed on the integrated circuit memory device, to drive a voltage level in accordance with the output voltage setting;
a comparator to provide a signal that indicates a direction to adjust the output voltage setting based on a comparison between a reference voltage level and a signal derived from the voltage level; and
a counter, having a count value, to adjust the output voltage setting in response to the signal that indicates the direction to adjust the output voltage setting,
wherein the register is coupled to the counter in response to a signal that indicates loading the register with the count value.

26. A system comprising:
a memory controller to provide a value representative of an integrated circuit memory device output voltage setting; and
an integrated circuit memory device, coupled to the memory controller, the integrated circuit device including:
a register to store the value representative of the integrated circuit memory device output voltage setting;
a circuit that holds a value representative of an adjustment to the integrated circuit memory device output voltage setting; and
an output driver to output a drive voltage to adjust the integrated circuit memory device output voltage setting, wherein a signal is generated based on a comparison between a signal derived from the drive voltage and a reference voltage, the signal to update the value representative of the adjustment to the integrated circuit memory device output voltage setting,
wherein the integrated circuit memory device output voltage setting is adjusted during a memory refresh operation.

27. The system of claim 26, wherein the memory controller includes an output driver to output a drive voltage to adjust a memory controller output voltage setting, wherein a signal is generated based on a comparison between a signal derived from the drive voltage of the memory controller and a reference voltage, the signal to update the value representative of the adjustment to the memory controller output voltage setting.

28. The system of claim 26, further including:
a divider circuit coupled to the output driver to generate the signal derived from the drive voltage by dividing between a predetermined voltage and the drive voltage; and
a comparator circuit to receive the reference voltage and the signal derived from the drive voltage, the comparator to generate a signal which indicates which direction to adjust the integrated circuit memory device output voltage setting based on the comparison.

29. The system of claim 26, wherein the reference voltage is presented on the integrated circuit memory device.

30. A system comprising:

a memory controller to provide a value representative of an integrated circuit memory device output voltage setting; and an integrated circuit memory device, coupled to the memory controller, the integrated circuit device including:

a register to store the value representative of the integrated circuit memory device output voltage setting;

a circuit that holds a value representative of an adjustment to the integrated circuit memory device output voltage setting; and an output driver to output a drive voltage to adjust the integrated circuit memory device output voltage setting, wherein a signal is generated based on a comparison between a signal derived from the drive voltage and a reference voltage, the signal to update the value representative of the adjustment to the integrated circuit memory device output voltage setting;

a divider circuit coupled to the output driver to generate the signal derived from the drive voltage by dividing between a predetermined voltage and the drive voltage; and a comparator circuit to receive the reference voltage and the signal derived from the drive voltage, the comparator to generate a signal which indicates which direction to adjust the integrated circuit memory device output voltage setting based on the comparison, wherein the signal that indicates which direction to adjust the integrated circuit memory device output voltage setting is a binary signal that assumes first and second states, and wherein:

the first state indicates an increase to the integrated circuit memory device output voltage setting; and the second state indicates a decrease to the integrated circuit memory device output voltage setting.

31. A system comprising:

a memory controller to provide a value representative of an integrated circuit memory device output voltage setting; and an integrated circuit memory device, coupled to the memory controller, the integrated circuit device including:

a register to store the value representative of the integrated circuit memory device output voltage setting;

a circuit that holds a value representative of an adjustment to the integrated circuit memory device output voltage setting; and an output driver to output a drive voltage to adjust the integrated circuit memory device output voltage setting, wherein a signal is generated based on a comparison between a signal derived from the drive voltage and a reference voltage, the signal to update the value representative of the adjustment to the integrated circuit memory device output voltage setting, wherein the integrated circuit memory device output voltage setting is adjusted during initialization of the integrated circuit memory device, and wherein the integrated circuit memory device output voltage setting is periodically adjusted after the initialization.

32. A system comprising:

a memory controller to provide a value representative of an integrated circuit memory device output voltage setting; and an integrated circuit memory device, coupled to the memory controller, the integrated circuit device including:

a register to store the value representative of the integrated circuit memory device output voltage setting;

a circuit that holds a value representative of an adjustment to the integrated circuit memory device output voltage setting; and an output driver to output a drive voltage to adjust the integrated circuit memory device output voltage setting, wherein a signal is generated based on a comparison between a signal derived from the drive voltage and a reference voltage, the signal to update the value representative of the adjustment to the integrated circuit memory device output voltage setting, wherein the value is stored in the register in response to a signal that indicates manual loading of the register, and wherein the signal that indicates manual loading of the register is provided to the integrated circuit memory device.

33. A system comprising:

means for storing a value representative of an output driver voltage swing setting corresponding to an output driver disposed on a memory device;

means for producing a count value that is used to adjust the output driver voltage swing setting in response to a signal that indicates a direction to adjust the count value, wherein:

an amount of voltage swing of the output driver is adjusted in a first direction when a voltage level derived from an amount of voltage swing generated by the output driver exceeds a reference voltage level; and an amount of voltage swing of the output driver is adjusted in a second direction when the reference voltage level exceeds the voltage level derived from the amount of voltage swing generated by the output driver.

34. The system of claim 33, further comprising means for generating the signal that indicates the direction to adjust the count value based on a comparison between the reference voltage level and a signal derived from the amount of voltage swing.

35. The system of claim 34, further comprising a means for generating the signal derived from the amount of voltage swing.

* * * * *

UNITED STATES PATENT AND TRADEMARK OFFICE
CERTIFICATE OF CORRECTION

PATENT NO. : 6,975,160 B2
DATED : December 13, 2005
INVENTOR(S) : Garrett, Jr. et al.

It is certified that error appears in the above-identified patent and that said Letters Patent is hereby corrected as shown below:

Title page,
Item [75], Inventors, "William F. Stonecynher" should be -- William F. Stonecypher --.

Signed and Sealed this

Fourteenth Day of February, 2006

JON W. DUDAS
*Director of the United States Patent and Trademark Office*